United States Patent [19]

Donohue et al.

[11] Patent Number: 4,780,248

[45] Date of Patent: Oct. 25, 1988

[54] THICK FILM ELECTRONIC MATERIALS

[75] Inventors: Paul C. Donohue, Wilmington, Del.; Vincent P. Siuta, Cherry Hill, N.J.

[73] Assignee: E. I. Du Pont de Nemours and Company, Wilmington, Del.

[21] Appl. No.: 12,133

[22] Filed: Feb. 6, 1987

[51] Int. Cl.$^4$ .............................. H01B 1/06; B32B 5/16
[52] U.S. Cl. .................................... 252/518; 252/500; 252/512; 252/514; 427/212; 427/215; 427/216; 428/403; 428/406; 428/701; 428/702; 428/704
[58] Field of Search ............... 428/325, 328, 329, 331, 428/403, 406, 698, 701, 702, 704; 252/518, 500, 512, 514; 427/215, 216, 212

[56] References Cited

U.S. PATENT DOCUMENTS

| | | | |
|---|---|---|---|
| 1,763,268 | 6/1930 | Slepian . | |
| 2,033,103 | 3/1936 | Beyersdorfer | 106/36.1 |
| 2,617,773 | 11/1952 | Nagy et al. | 252/301.5 |
| 3,343,984 | 9/1967 | Saums | 117/218 |
| 3,348,918 | 10/1967 | Kruse | 23/209.9 |
| 3,370,966 | 2/1968 | Schwartz et al. | 106/49 |
| 3,973,975 | 8/1976 | Francel et al. | 106/53 |
| 4,038,091 | 7/1977 | Francel et al. | 106/53 |
| 4,058,387 | 11/1977 | Nofziger | 65/32 |
| 4,098,611 | 7/1978 | Francel et al. | 106/53 |
| 4,099,977 | 7/1978 | Francel et al. | 106/53 |
| 4,120,678 | 10/1978 | Francel et al. | 65/32 |
| 4,292,619 | 9/1981 | Mutsaers et al. | 252/518 |
| 4,476,039 | 10/1984 | Hormadaly | 252/518 |
| 4,574,055 | 3/1986 | Asada et al. | 252/521 |

*Primary Examiner*—George F. Lesmes
*Assistant Examiner*—James B. Monroe

[57] ABSTRACT

Thick film electronic compositions comprising finely divided particles of electrically functional material and a PbO-compatible inorganic binder dispersed in an organic medium in which 0.1 to 10.0% wt. lead nitrate is coated on the surface of at least one of the solids components.

16 Claims, No Drawings

THICK FILM ELECTRONIC MATERIALS

FIELD OF INVENTION

The invention is directed to thick film electronic materials having improved burnout properties, particularly when they are fired in low oxygen-containing atmospheres.

BACKGROUND OF INVENTION

In the processing of thick film electronic materials—conductors, resistors and dielectrics—, it is frequently difficult to effect removal of the organic medium during firing without leaving carbonaceous residues and stains on the fired material layers. This is especially true when the electronic material is dispersed in an organic medium which contains cellulosic components such as ethyl cellulose, hydroxyethyl cellulose and ethylhydroxyethyl cellulose.

Cellulosic materials are often preferred components for organic media because they impart to thick film dispersions made therefrom excellent dispersion stability and printing rheology. Such thick film layers typically have good printability, can be printed rapidly, and yield smooth printed layers.

Heretofore, it has been necessary to substitute all or part of the cellulosic materials with acrylic polymers, which ordinarily have better burnout characteristics. However, such acrylic polymers do not have as good rheological properties as the cellulosic binders.

Therefore, it would be very desirable to have a means by which one could retain the use of cellulosic binder materials in thick film electronic compositions while simultaneously obtaining the good burnout characteristics usually associated only with acrylic polymers.

SUMMARY OF THE INVENTION

In one aspect, the invention is directed to finely divided particles of electrically functional materials coated with a layer of lead nitrate in the amount of from 0.1 to 10.0 % by weight thereof.

In a second aspect, the invention is directed to thick film electronic compositions comprising finely divided particles of electrically functional material and a lead oxide-compatible glass, either or both having coated on the surface thereof from 0.1 to 10.0% by weight lead nitrate, dispersed in an organic medium.

In a third aspect, the invention is directed to electrically functional layers formed by applying at least one layer of the above-described thick film composition and firing the layer(s) at a temperature sufficient to effect volatilization of the organic medium and sintering of the lead oxide-compatible glass.

PRIOR ART

U.S. Pat. No. 1,763,268—Slepian

Molded resistor plates containing lamp black and a residue of oxidizing agents such as $KNO_3$ or $BaNO_3$ for the purpose of oxidizing the lamp black, thus increasing the resistivity of the resistors made therefrom.

U.S. Pat. No. 2,033,103—Beyersdorfer

In the manufacture of lead-containing glasses, the lead component is added as $Pb(NO_3)_2$ which upon oxidizing fusion is converted to PbO, which dissolves in the glass.

U.S. Pat. No. 2,617,773—Nagy

Calcium tungstate phosphors are formulated with lead nitrate which decomposes to the oxide upon firing the phosphors.

U.S. Pat. No. 3,343,984—Saums et al.

A glass-forming oxide $LiNO_3$ is incorporated in an enamel which is baked on wire insulation to improve the organic medium burnout characteristics of the enamel.

U.S. Pat. No. 3,348,918—Kruse

Method for removing carbon from carbon-diamond mixtures by contacting the mixture with PbO and oxygen at 250-500 C. U.S. Pat. No. 3,370,966-Schwartz et al.

An oxidizing agent such as $PbO_2$ is added to $PbO/ZnO/B_2O_3$ glass to facilitate burnout of adulterants from the glass.

U.S. Pat. Nos. 3,973,975, 4,038,091, 4,099,977 and 4,120,678, Francel et al.

The reduction of PbO during firing of sealing glass paste is avoided by incorporating, inter alia, $Pb_3O_4$ particles into the paste.

U.S. Pat. No. 4,058,387 Nofziger

In a PbO-containing sealing glass composition particles of $Pb(NO_3)_2$ are added to prevent reduction of the PbO to Pb during firing.

U.S. Pat. No. 4,098,611 Francel et al.

Reduction of PbO during firing of sealing glass pastes is avided by incorporating $LiNO_3$ and/or $AgNO_3$ particles into the paste.

U.S. Pat. No. 4,476,039 Hormadaly

Staining in ruthenium oxide-based resistors is reduced by addition of particles of a metal compound which thermally decomposes to release $O_2$ therefrom. Among the suitable metal compounds mentioned are nonalkaline nitrates among which $Pb(NO_3)_2$ is mentioned.

DETAILED DESCRIPTION OF THE INVENTION

Electrically Functional Material

The use of $Pb(NO_3)_2$ coatings on electrically functional materials to facilitate burnout of organic media from thick film compositions is applicable to materials having any type of electrical functionality, i.e., conductors, resistors, and dielectrics as well as the inorganic binders which may be used in conjunction with them. The amount of $Pb(NO_3)_2$ which may be used relative to the total solids is from 0.1 to 10% wt. with from 0.2 to 5% wt. being preferred. Below 0.1% wt. the beneficial effect is not sufficiently evident and above 10% wt. the amount of PbO formed may have an adverse effect on the rheology of the inorganic binder.

So long as the $Pb(NO_3)_2$ is within the above described range, it does not matter if it is coated on the primary electrically functional material particles or on the inorganic binder particles or on both of them. The particle size distribution of the solids, both the electrically functional material and the inorganic binder, is not critical with respect to the operability of the invention. It may therefore be freely adjusted to conform with the rheological, printing and other concerns of the user.

Though lead nitrate and other metal nitrates have been used for various purposes and in various ways in the prior art, the use of lead nitrate in accordance with the invention is both different from the prior art and more effective because it is utilized in the form of a coating on particles in thick film pastes. An important function of the lead nitrate in this form is to faciliate the burnout of residual organic medium. Because it is so intimately associated with the particles onto which it is coated, the burnout is achieved more homogeneously than when used simply as a powder additive and the lead nitrate functions effectively at lower concentration levels than if it were added in the form of a particulate additament.

Lead nitrate is superior to other nitrates in thick film compositions for several reasons. One advantage is that it decomposes at a relatively low temperature. Consequently burnout is achieved before glass flow takes place in thick film compositions which contain an inorganic binder. Such low temperature burnout is particularly useful in nitrogen firing where residual carbon can reduce glasses at higher firing temperatures.

Another advantage of the use of lead nitrate is the fact that its decomposition product, PbO, can in many instances act to enhance glass flow by dissolving in the glass during firing. Furthermore, the PbO can itself function as an agent for bonding metal films to the substrates both in air and nitrogen firing.

A still further advantage of lead nitrate is that it does not form hydrates which have been observed to cause viscosity instability by adsorption of water. This can be seen by adding a drop of water to a paste and noting that a subsequent viscosity increase occurs. Pastes with lead nitrate-coated powder are by contrast stable.

Inorganic binder

The inorganic binder may be any glass of suitable sintering temperature in which PbO is substantially soluble. Thus, the glass may be either a vitrifying or devitrifying glass. In the case of the devitrifying glass it is necessary merely that PbO be soluble in the noncrystalline matrix glass.

Formulation

It is necessary that the composition of the invention contain at least 0.1% wt. lead nitrate, basis solids, but no more than about 10% wt. Furthermore, for use in nitrogen-fired systems, it is preferred to use at least 2.5% wt. lead nitrate. Because the organic medium constitutes only about 25 to 30% wt. of the total composition, the required amount of lead nitrate burnout agent is 0.3 to about 30%, basis organic medium.

The lead nitrate is dispersed in the composition by applying it as a coating on either or both of the solids components. That is, the lead nitrate can be coated on either the electrically functional material or it can be coated on the glass or it can be coated on both materials.

The coating process can be carried out by either of the following described processes with equivalent effectiveness:

Process A:
(1) Form slurry of the functional solids and frit in water;
(2) Deagglomerate the suspended solids as may be necessary by additional mixing;
(3) Add lead nitrate to the slurry and continue agitation of the slurry to dissolve completely the lead nitrate; and
(4) Evaporate the slurry containing the dissolved lead nitrate to dryness.

Process B:
(1) Dissolve the lead nitrate in water;
(2) Form a slurry of the functional solids and frit in the water containing dissolved lead nitrate;
(3) Evaporate the slurry containing the dissolved lead nitrate to dryness.

The evaporation is not difficult and can be carried out at any temperature below the decomposition temperature of the lead nitrate, i.e. below about 473C. Vacuum evaporation can, of course, be employed in this step, but is not necessary.

Thick film compositions are then formed from the solids by conventional methods, for example by mixing the solids with organic medium and then roll milling the admixture to obtain uniform dispersion of the solids.

TEST PROCEDURES

A. Adhesion

The adhesion was measured using an "Instron" pull tester in a 90° peel configuration at a pull rate of 0.5 inches per minute. Twenty gauge pre-tinned wires were attached to 80 mil×80 mil (2×2 mm.) pads by dipping for 10 seconds in 62 Sn/36 Pb/2 Ag solder at 220 C or in 63 Sn/37 Pb solder at 230 C using Alpha 611 flux. Aging studies were carried out in a Blue M Stabil-Therm ® oven controlled at 150 C. After aging, test parts were allowed to equilibrate several hours in air before the wires were pulled.

B. Capacitance

Capacitance may be defined as the proportionality constant between electric charge and applied voltage (C=Q/V).

For a parallel plate condenser, capacitance may be calculated from the formula $$C = KA/4\, d,$$

wherein
K is the dielectric constant.
A is the plate area in $cm^2$
d is the dielectric thickness in cm. Capacitance by this formula is given in electrostatic units. One farad = $9 \times 10^{11}$ electrostatic units.

Capacitance was measured using a General Radio Automatic RLC Bridge Model 1683 at 120 Hz or 1 KHz frequency and 1 V A.C. Capacitance was generally measured between the anode lead and the soldered cathode coating. In some cases leads were soldered to the cathode coating and were used for measurements.

C. Dissipation Factor

Dissipation factor is the tangent of the angle ($\sigma$) by which the current lags from the 90° vector to the voltage. Here it is expressed as percent dissipation factor (100×tangent $\sigma$).

Capacitance and dissipation factors are measured using Hewlett-Packard's HP 4274A multi-frequency LCR meter, while insulation resistance is measured using super megohm meter Model RM170 (Biddle Instruments, AVO Ltd., U.K.). Each number is the average of at least 10 measurements. Insulation resistance measurements are made after charging the capacitor with the respective working voltage for 1 minute. Measurements are made in both directions and, on the average, no differences of order of magnitude in IR are found. In general, specifications for C and IR are established as minimum values and, for DF, as maximum permissible values for a given use.

D. Resistance Measurement and Calculations

The test substrates are mounted on terminal posts within a controlled temperature chamber and electrically connected to a digital ohm-meter. The temperature in the chamber is adjusted to 25 C and allowed to equilibrate, after which the resistance of each substrate is measured and recorded.

The temperature of the chamber is then raised to 125 C and allowed to equilibrate, after which the resistance of the substrate is again measured and recorded.

The temperature of the chamber is then cooled to −55 C and allowed to equilibrate and the cold resistance measured and recorded.

The hot and cold temperature coefficients of resistance (TCR) are calculated as follows:

$$\text{Hot TCR} = \frac{R_{125\ C} - R_{25\ C}}{R_{25\ C}} \times (10.000)\ \text{ppm/C}$$

$$\text{Cold TCR} = \frac{R_{-55\ C} - R_{25\ C}}{R_{25\ C}} \times (-12.500)\ \text{ppm/C}$$

The values of $R_{25}\ C$ and Hot and Cold TCR (HTCR and CTRC respectively) are averaged and $R_{25}\ C$ values are normalized to 25 microns dry printed thickness and resistivity is reported as ohms per square at 25 microns dry print thickness. Normalization of the mutliple test values is calculated with the following relationship:

$$\text{Normalized Resistance} = \frac{\text{Avg. measured resistance} \times \text{Avg. dry print thickness, microns}}{25\ \text{microns}}$$

E. Solder Acceptance Test

The solder acceptance test pattern contains different size solder pads ranging from $10 \times 20$ mil ($250 \times 500\ \mu$ to $80 \times 80$ mil ($2 \times 2$ mm) in size. The thick film conductor composition is printed and fired onto a 1 x 1 inch alumina substrate. Three firings to 850 C in air are used for precious metal conductor compositions to simulate end use conditions. Copper conductors are fired to 900 C in nitrogen. In both cases the conductor is held 10 minutes at peak temperature and the total firing cycle is about 60 minutes.

The fired test pattern is dipped in an RMA flux such as Alpha 611[1] and drained of excess flux. Then the part is preheated for 2-3 seconds by dipping the bottom edge of the substrate into the molten solder. The choice of flux, solder composition and solder pot temperature is selected to simulate end use conditions. After preheating, the entire part is immersed into the solder for 5 seconds. The rate of dipping and withdrawal is about 0.5 to 1.0 cm/sec. After withdrawal the soldered test pattern is allowed to cool. Flux residue of removed by washing the part in a suitable solvent such as trichloroethane or isopropanol.

(1) Alpha Metals, Jersey City, NJ.

Solder acceptance is evaluated by counting the number of pads completely wetted by solder. Any pad not completely wetted is considered nonwetted. The number of completely solder wetted pads is divided by the total number of pads to calculate solder acceptance on a percentage basis.

EXAMPLES

Example 1

Use of $Pb(NO_3)_2$ in Low Temperature $N_2$-Fireable Encapsulant

Lead nitrate was coated on low softening (365 C) zinc lead borosilicate glass. The coating was done by dissolving 2.4 g $Pb(NO_3)_2$ in $H_2O$; stirring in 50 g of the glass powder, and evaporating the coated powder to dryness at 120 C for 24 hours. The powder was made into a thick film paste by mixing on a muller with organic medium, and $SiO_2$ filler. The filler is intended to restrict excessive glass flow on firing. The following mixture was made: 4.35 g of the above coated powder; 0.65 g $SiO_2$ powder, 0.25 g green pigment and 1.5 g organic medium. The medium contained 3.1% ethylcellulose, 95.84% Texanol®[1] solvent and 1.06% tridecylphosphate.

(1) 2,2,4-trimethylpentanediol-1,3-monoisobutyrate manufactured by Eastman Kodak Company, Rochester, NY.

The paste was tested as an encapsulant over previously fired Cu circuitry and two thick film resistors on alumina substrates. The paste was screen printed on the substrates, dried at 120 C for 10 minutes and fired in a $N_2$ atmosphere belt furnace with an approximate 10-minute peak temperature of 535 C.

The resulting film was smooth and free of black bubbly areas thus indicating good vehicle burnout. Resistance shift and Cu stain were observed to be minimal.

Examples 2 and 3

Lower Softening Encapsulant

A quantity of low melting encapsulant was prepared by the procedure of Example 1. A solution was prepared in which 121.86 g of $Pb(NO_3)$ was dissolved in 2538 g $H_2O$. The following low softening glasses were added: Glass A from Example 1 and Glass B (wt. % PbO 82.7, $B_2O_3$ 11.2, $PbF_2$ 5, $SiO_2$ 1.1) 846.72 g. The mixture was evaporated to dryness to coat the glasses. The powder was roll milled: Glass A and Glass B with $Pb(NO_3)_2$ coating 63.5% $SiO_2$ 9.49%, Green Pigment 2.92% and the cellulosic vehicle described in Example 1 24.4%.

The paste was printed over Cu circuitry with resistors as described above and fired at 550 C in a $N_2$ belt furnace. The smoothness of the fired film indicated that the organic medium was burned out quite completely.

To determine the optimum $Pb(NO_3)_2$ level for complete burnout with minimal stain, a paste was prepared similar to that above, but with no $Pb(NO_3)_2$. It was blended with a portion of the paste with $Pb(NO_3)_2$ to reduce the amount of $Pb(NO_3)_2$ from 4.8 to 4.3% wt. It was printed and fired as described. The resulting film showed evidence of incomplete vehicle burnout. Thus for this glass combination, the optimum amount of Pb $(NO_3)_2$ is between 4.3 and 4.8% wt.

Smooth, completely burned-out films were achieved down to 450 C in the $N_2$ belt furnace. Such lower firing temperatures are preferred to minimize resistor shift.

Example 4

Use of $Pb(NO_3)_2$ to Burn Out Vehicle in Higher Softening Point $N_2$-Fireable Encapsulants A glass having a softening point of 660 C ($SiO_2$ 56.5, PbO 17.2, $Al_2O_3$ 9.1, CaO 8.6, $B_2O_3$ 4.5, $Na_2O$ 2.4 and $K_2O$ 1.7) was coated with $Pb(NO_3)_2$ by dissolving 0.54 g $Pb(NO_3)_2$ in water, adding 11.27 g glass and evaporating to dryness. A paste was prepared using the same cellulosic vehicle described above (5 g $Pb(NO_3)_2$-coated glass and 1.7 g of the above-described cellulosic vehicle). It was treated as an encapsulant for Cu-electroded capacitor previously prepared on alumina substrates. The paste was screen printed, dried and fired at 900 C/10 min peak in an $N_2$ atmosphere furnace. The resulting film was smooth and completely burned out as indicated by the clarity or transparency of the fired film.

Example 5

Use of $Pb(NO_3)_2$ to Burn Out Vehicle in a High K Dielectric Capacitor

Fifty grams of $TiO_2$ powder were mixed in water with 1.2 g $Pb(NO_3)_2$ then evaporated to dryness to coat the $TiO_2$. The following mixture was prepared and roll milled: 48 g $TiO_2$ coated powder, 2.53 g glass binder, 13.0 g of the cellulosic vehicle (previously described). The paste was used to prepare capacitors on copper electrodes. Films were fired at 900° in an $N_2$ belt furnace. The resulting dielectric films were white indicating good burnout. The capacitors showed high $K \approx 200$ with low dissipation factor 0.2%.

Examples 6-8

Use of $Pb(NO_3)_2$ in a Copper Conductor Composition

2% $Pb(NO_3)_2$ was coated on copper powder according to the following compositions and procedure:

| Compositions | % | grams (g) |
|---|---|---|
| Lead Nitrate Solution (A) | | |
| $Pb(NO_3)_2$ | 10.00 | 100.0 |
| Citric Acid | .05 | 0.5 |
| D.I. Water | 89.95 | 899.50 |
| | 100.00 | 1000.00 |
| Copper Slurry (B) | | |
| Lead Nitrate Solution (A) | 16.7 | 1000.0 |
| Cu Powder | 83.3 | 5000.0 |
| | 100.0 | 6000.0 |

Procedure

1. Prepare 1000 g Lead Nitrate Solution (A) by dissolving 10% $Pb(NO_3)_2$ l and .05% Citric acid in D.I. water.
2. Transfer Solution (A) to high-shear mixer and gradually add 5000 g Cu powder.
3. Stir mixture slowly for 15 minutes to wet out powder. Then increase to high speed to break down agglomerates. Continue high-shear mixing for 15 minutes until copper paste has a smooth, uniform, "whipped cream" consistency.
4. Transfer copper slurry (B) into tray and freeze dry to produce a fine, deagglomerated copper powder coated uniformly with $Pb(NO_3)_2$.

The above lead nitrate-coated Cu powder was tested in the following paste composition and compared to standard Du Pont 9924Q (frit-bonded) and Du Pont 6022 oxide-bonded copper conductors. All Cu compositions were fired to 900 C for 10 minutes in a one hour cycle.

| Composition of Cu conductor C | % |
|---|---|
| 2% $Pb(NO_3)_2$-Coated Cu Powder | 85.0 |
| Organic Medium | 15.0 |
| | 100.0 |

| Properties of Cu Conductors | | 9924Q | 6022 | C |
|---|---|---|---|---|
| Sheet Resistivity | $m\Omega$/sq/10 $\mu$m | 3.2 | 3.0 | 2.7 |
| Solder Acceptance | % | 90 | 85 | 90 |
| Adhesion, Peel | Newtons | 24 | 25 | 24 |
| % Retained Carbon* | % | 0.042 | 0.020 | .016 |

*Carbon analysis of Cu film after firing to burnout temperature of 600 C.

Examples 9 and 10

Use of $Pb(NO_3)_2$ in a Ag/Pt Conductor Composition

A mixture of 100 Ag:1 Pt powders was coated with 1.5% $Pb(NO_3)_2$ by a slurry process similar to that described above. This coated powder was then used in the following conductor composition D which exhibited excellent properties when fired in air to 850 C for 10 minutes in a one hour cycle.

| Composition of Ag/Pt Conductor D | % |
|---|---|
| $Pb(NO_3)_2$ Coated Ag/Pt | 79.8 |
| Frit F | 2.0 |
| Cu Bi Ruthenate | 1.0 |
| Organic Medium | 17.2 |
| | 100.0 |

| Properties of Cu Conductors | | D | E |
|---|---|---|---|
| Sheet Resistivity | $m\Omega$/sq/10 $\mu$m | 3.6 | 4.2 |
| Solder Acceptance | % | 100 | 95 |
| Initial Adhesion | Newtons | 27 | 18 |
| Aged Adhesion, Peel | | | |
| 100 hours at 150 C. | Newtons | 26 | 13 |
| 2000 hours at 150 C. | Newtons | 18 | — |

The superior properties of the Ag/Pt conductor (D) made from $Pb(NO_3)_2$ coated powder is evident by comparison with E. Sample E was a similar (not identical) composition made from an admixture of Ag and Pt powders. Adhesion was poor even though E contained 2% PbO in lieu of $Pb(NO_3)_2$ as a bonding agent.

| | % |
|---|---|
| Compostion of E (No $Pb(NO_3)_2$ Coating): | |
| Ag Powder | 77.20 |
| Pt Powder | 0.77 |
| PbO | 2.00 |
| Frit F | 2.00 |
| Cu Bi Ruthenate | 1.00 |
| Organic Medium | 17.03 |
| | 100.00 |
| Composition of Frit F (milled mixture): | |
| Borosilicate glass | 50.0 |
| $MnO_2$ | 21.5 |
| ZnO | 14.5 |
| CuO | 14.0 |

We claim:

1. Finely divided particles of electrically functional solids individually coated with a layer of solid lead nitrate which constitutes 0.1 to 10% by weight of the uncoated particles.

2. The coated solid particles of claim 1 in which the solids are comprised of resistance oxide.

3. The coated solid particles of claim 1 in which the solids are comprised of dielectric ceramic oxide.

4. The coated solid particles of claim 1 in which the solids are comprised of conductive metal.

5. Finely divided particles of glass individually coated with a layer of solid lead nitrate which constitutes 0.1 to 10% by weight of the uncoated particles.

6. The composition of claim 5 in which the electrically functional material is a resistance oxide on the particle surfaces of which lead nitrate is coated.

7. The composition of claim 6 in which the lead nitrate is coated on the particle surfaces of both the resistance material and the inorganic buffer.

8. The composition of claim 5 in which the electrically functional material is a dielectric ceramic oxide on the particle surfaces of which lead nitrate is coated.

9. The composition of claim 8 in which the lead nitrate is coated on the particle surfaces of both the dielectric ceramic oxide and the inorganic binder.

10. A dielectric layer comprising a thick film of the composition of claim 8 or claim 9 which has been printed upon a substrate and fired to effect decomposition of the lead nitrate, complete voltilization of the organic medium therefrom and densification of the dielectric ceramic oxide.

11. The composition of claim 5 in which the electrically functional material is a conductive metal on the particle surfaces of which lead nitrate is coated.

12. The composition of claim 9 in which the lead nitrate is coated on the particle surfaces of both the conductive metal and the inorganic binder.

13. A conductive layer comprising a thick film of the composition of claim 11 or claim 12 which has been printed upon a substrate and fired to effect decomposition of the lead nitrate, complete volatilization of the organic medium therefrom and sintering of the conductive metal.

14. In a thick film electronic composition comprising finely divided particles of an electrically functional material and a PbO-compatible inorganic binder dispersed in an organic medium, the improvement which comprises incorporating into the dispersion as a coating on individual particles of at least one of the solids components 0.1 to 10% by weight, basis weight of the coated component before being coated, of solid lead nitrate.

15. A thick film encapsulant composition comprising finely divided particles of PbO-compatible glass dispersed in an organic medium, the individual particles of the glass being coated with 0.1 to 10% by weight solid lead nitrate.

16. An encapsulant coating comprising a thick film layer of the composition of claim 15 which has been printed upon an electrically functional substrate and fired to effect decomposition of the lead nitrate, complete volatilization of the organic medium therefrom and liquid phase sintering of the glass.

* * * * *

UNITED STATES PATENT AND TRADEMARK OFFICE
CERTIFICATE OF CORRECTION

PATENT NO. : 4,780,248

DATED : October 25, 1988

INVENTOR(S) : Paul C. Donohue and Vincent P. Siuta

It is certified that error appears in the above-identified patent and that said Letters Patent is hereby corrected as shown below:

In claim 7, column 9, line 21, delete "buffer" and insert -- binder --.

Signed and Sealed this

Seventh Day of March, 1989

Attest:

DONALD J. QUIGG

Attesting Officer

Commissioner of Patents and Trademarks